United States Patent [19]
Seki

[11] Patent Number: 5,572,199
[45] Date of Patent: Nov. 5, 1996

[54] ABSOLUTE SIGNAL DETECTING METHOD AND ABSOLUTE ENCODER

[75] Inventor: Shigeo Seki, Iida, Japan

[73] Assignee: Tamagawa Seiki Kabushiki Kaisha, Nagano, Japan

[21] Appl. No.: 357,446

[22] Filed: Dec. 16, 1994

[30] Foreign Application Priority Data

Mar. 29, 1994 [JP] Japan .................................. 6-059282

[51] Int. Cl.$^6$ .................................................. G08C 19/16
[52] U.S. Cl. ................................ 340/870.01; 340/870.05; 340/870.16
[58] Field of Search .................. 340/870.01, 870.02, 340/870.05, 870.16, 870.18, 870.19, 870.28, 870.29; 341/35, 3, 13; 250/231.1 B

[56] References Cited

U.S. PATENT DOCUMENTS 4,736,187  4/1988  Kibrick et al. .............. 341/13

FOREIGN PATENT DOCUMENTS 0341314  11/1989  European Pat. Off. .

OTHER PUBLICATIONS

Electroics Letters, vol. 25, No. 21, Oct. 21, 1989, pp. 1436–1437, "Incremental Digital Position Encoder With Error Detection and Correction," Ross J. N. et al.

Primary Examiner—Jeffery Hofsass
Assistant Examiner—Andrew Hill
Attorney, Agent, or Firm—Brooks Haidt Haffner & Delahunty

[57] ABSTRACT

An absolute signal detecting method and an absolute encoder according to the present invention load a n-bit positional signal (3) to a counting circuit (12) through rotating a code plate (1) at power ON, and can obtain an absolute encoder signal (12A) after this load through performing count up/down of the counting circuit (12) with an incremental signal (2).

4 Claims, 1 Drawing Sheet

5,572,199

ABSOLUTE SIGNAL DETECTING METHOD AND ABSOLUTE ENCODER

BACKGROUND OF THE INVENTION

1. Field of the Invention

The present invention relates to an absolute signal detecting method and an absolute encoder, and more particularly, to the new improvement for obtaining an absolute encoder in a structure almost similar to an incremental encoder.

2. Description of The Related Art

Heretofore, a commonly used absolute encoder, for example, one disclosed in Japanese Patent Laid-Open No. Hei 4-3 19621 uses one-track type of n-bit positional signals (well-known recurrent random number codes), detect said n-bit positional signals through disposing n pieces of light receiving elements corresponding to the n bits toward the track (toward the circumference), and output the n-bit positional signals as positional signals accompanying displacement of an input axis position of the encoder.

Since conventional encoders are composed as above described, there are following issues.

Thus, the necessary number of signal processing circuits corresponding to the n elements corresponding to said n bits is n series, problems such as signal adjustment of each of n series of circuits, and variance and frequency characteristics between n series occur, and hence, it is very difficult to produce absolute encoders in high reliability.

The present invention is to solve above issues, and in particular, an object of the present invention is to obtain an absolute signal detecting method and an absolute encoder in a structure almost similar to an incremental encoder.

SUMMARY OF THE INVENTION

An absolute signal detecting method according to the present invention is an absolute signal detecting method using a n-bit positional signal formed at one track of a code plate and an incremental signal corresponding to said n-bit positional signal, said absolute signal detecting method comprising the steps of: performing load to a counting circuit after reading said n-bit positional signal at power ON; making said counting circuit count up and down with said incremental signal; detecting an input axis position.

In further detail, this is a method which further comprises: scanning said n-bit positional signal with a latch circuit using changing points of said incremental signal; loading the n-bit positional signal to said counting circuit through a parallel signal converter.

A load command circuit for said n-bit positional signal is a means to detect the frequency of said incremental signal, and not to issue a load command to said counting circuit at the rotation speed over the predetermined value.

In further detail, when the load of said n-bit positional signal to said counting circuit is completed, the load command circuit is a means to output a load completion signal.

An absolute encoder according to the present invention detects an absolute signal using a n-bit positional signal formed at one track of a code plate and an incremental signal corresponding to said n bits, said absolute encoder comprising an UP/DOWN circuit where said incremental signal is inputted, a counting circuit connected to said UP/DOWN circuit, a latch circuit where said n-bit positional signal and said incremental signal are inputted, a parallel signal converter connected to said latch circuit and said counting circuit, and a load command circuit connected to said parallel signal converter and counting circuit.

In further detail, between said parallel signal converter and counting circuit, a pure binary signal converter is provided.

An absolute signal detecting method and an absolute encoder according to the present invention rotate a code plate having a randomized-type of n-bit positional signal formed at one track, detect this n-bit positional signal with two light receiving elements for a n-bit signal and a n-bit signal, and scan each bit of this n-bit positional signal with a latch circuit by a leading edge (a trailing edge is also possible) that is a changing point of an incremental signal corresponding to this n-bit signal.

The n-bit positional signal detected with this scanning is stored as a parallel signal per bit in a counting circuit through a parallel signal converter from the latch circuit, and preparation is completed.

It is possible to obtain an absolute signal through inputting to the counting circuit the result of addition/subtraction corresponding to the upward/downward value of the incremental signal generated with rotation of the code plate on the basis of the n-bit positional signal stored in said counting circuit. In addition, the light receiving element for the n-bit signal is used for compensation of lack of light quantity of the n-bit positional signal, and in the present invention, above described operations can be obtained with only the light receiving element for the n-bit signal.

DETAILED DESCRIPTION OF THE PREFERRED EMBODMENTS

Figure 1:
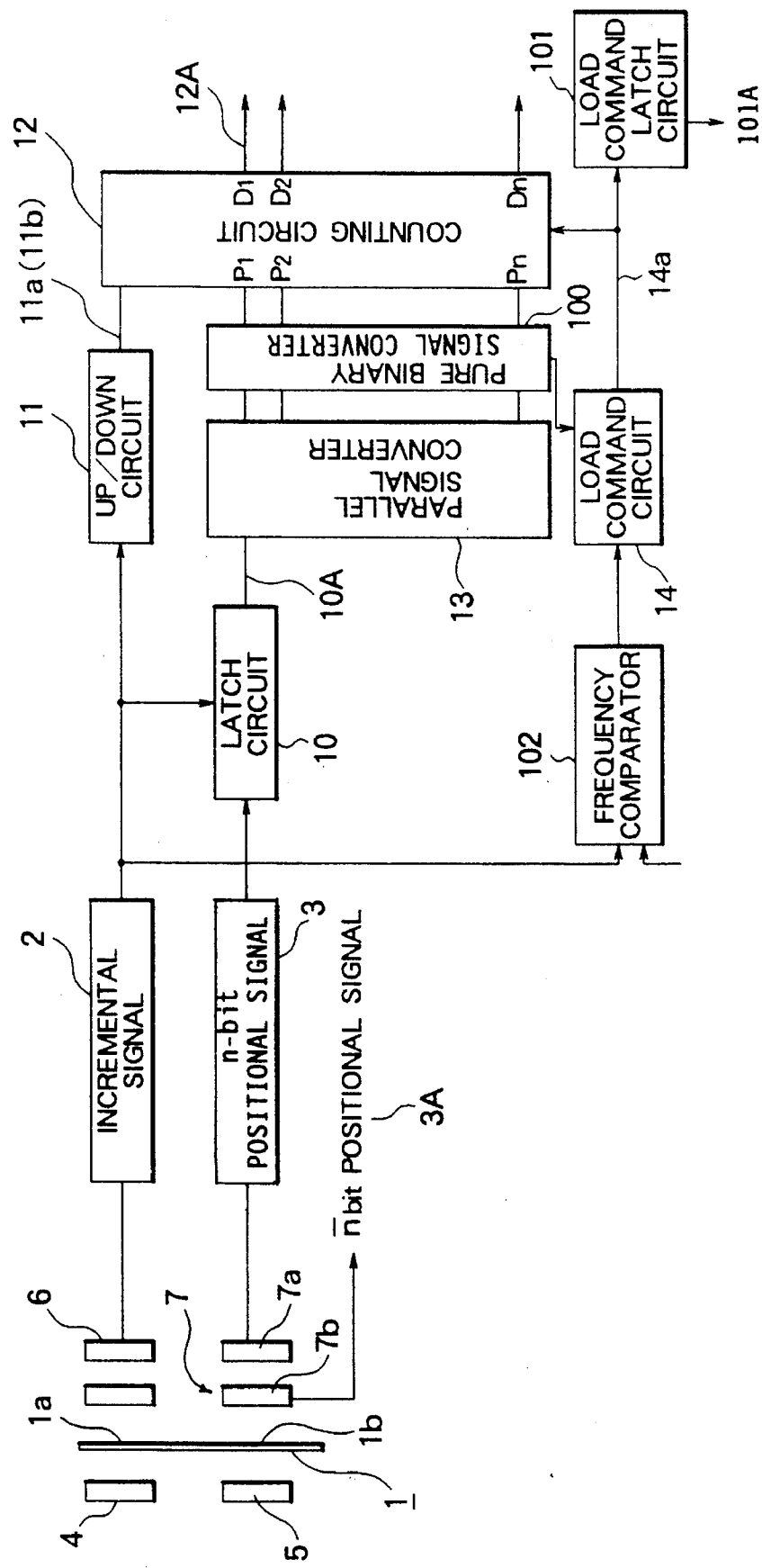
FIG. 1 is a structural diagram showing an absolute encoder according to the present invention.

Hereafter, preferable embodiments of an absolute signal detecting method and an absolute encoder according to the present invention will be explained in detail with drawings.

A code plate is shown as the code 1 in FIG. 1, and the code plate has a first track 1a with a code for a known incremental signal 2, a second track 1b with a code for a n-bit positional signal 3 (composed of well-known recurrent random number codes), and is provided in free rotation. In the left of this code plate 1 in FIG. 1, a first light source 4, and a second light source 5 corresponding to respective tracks 1a and 1b are provided individually.

A light receiving section 6 for an incremental signal, and a light receiving section 7 for an absolute signal corresponding to said respective tracks 1a and 1b are provided, and this light receiving section 7 for an absolute signal is composed of a first light receiving section 7a to output a n-bit positional signal 3 and a second light receiving section 7b to output a n-bit positional signal 3A.

Said incremental signal 2 and n-bit positional signal 3 are inputted to the latch circuit 10, and this incremental signal 2 is inputted to an UP/DOWN circuit 11 connected to a counting circuit 12. Said latch circuit 10 is connected to a parallel signal converter 13 for conversion of a serial signal to a parallel signal, which is connected to said counting circuit 12 through a pure binary signal converter 100. A load command circuit 14 connected to this pure binary signal converter 13 is connected to said counting circuit 12 and a load command latch circuit 101, and load (storage) to the counting circuit 12 is started with a load command signal 14a from this load command circuit 14. In addition, this incremental signal 2 is inputted to the load command circuit 14 through a frequency comparator 102, and only when the incremental signal 2 indicates, for example, that a rotary encoder is rotating at the speed less than or equal to 300 RPM, the load command signal 14a is issued.

Next, operations will be described. At first, this embodiment rotates a code plate 1 (for example, if the axis position is 100°/360°, the number, 100 becomes the absolute value) through operating an absolute encoder connected to a robot and the like so as to load (store as an initial value) a n-bit positional signal 3 in a parallel mode to a counting circuit 12, inputs to a latch circuit 10 the n-bit positional signal 3 in a random mode (for example, 0001) from the first light receiving section 7a of a light receiving section 7 for an absolute signal by the second track 1b of the code plate 1, and inputs also an incremental signal 2 in the same pitch corresponding to the pitch of this n-bit positional signal 3 to this latch circuit 10. In this latch circuit 10, this embodiment scans each bit of this n-bit positional signal 3 with a leading edge (a trailing edge is also possible) that is a changing point of the incremental signal 2, converts the n-bit positional signal 10A in a serial mode detected at this scanning to a parallel signal in a parallel signal converter 13 and a pure binary signal converter 100, and stores the n-bit positional signal as an absolute value in the counting circuit that starts load with a load command signal 14a. Therefore, storage of this n-bit positional signal 3 derived from the codes of the second track of the rotated code plate 1 is completed. At the time of this load completion to the counting circuit 12, a load completion signal 101A is issued. In addition, this frequency comparator 102 compares a rotation speed to the regular value so as to perform the load only when the rotation speed of the encoder is, for example, less than or equal to 300 RPM.

Next, in case this absolute encoder is used, the up/down direction of the incremental signal 2 generated with rotation of the code plate of an input axis (not shown) is detected with an UP/DOWN circuit, an UP signal 11a or a DOWN signal 11b is inputted to the counting circuit 12, and this calculation result is outputted as an absolute encoder signal 12A of the input axis position in the upward or downward mode through adding this incremental signal 2 in either direction to this n-bit positional signal 3 that is the absolute value.

Therefore, since the signal processing system for processing the n-bit positional signal 3 becomes one series, it becomes not necessary to use n channels of signal processing systems as conventional.

Since an absolute signal detecting method and an absolute encoder according to the present invention are composed of as above described, following effects can be obtained.

Thus, since as a n-bit processing system, the series number changes from the conventional n channels to one series, drastic hardware reduction can be attained.

Furthermore, since the frequency characteristic of the incremental signal is better than that of the n-bit positional signal due to detection in larger received-light quantity with a plurality of slits, the absolute signal in good frequency characteristic can be obtained.

Still more, after completion of load to the counting circuit, the absolute value can be obtained from only the incremental signal through having operated the counting circuit with the incremental signal.

What is claimed is:

1. An absolute signal detecting method using a n-bit positional signal formed on one track of a code plate and an incremental signal corresponding to said n-bit positional signal, said absolute signal detecting method comprising the steps of performing a load into a counting circuit after reading said n-bit positional signal at power ON; detecting an input axis position through performing count up/down of said counting circuit with said incremental signal, whereby a load command circuit for said n-bit positional signal detects the frequency of said incremental signal, and does not issue a load command to said counting circuit when the rotation speed is over a predetermined value.

2. An absolute signal detecting method recited in claim 1, which further comprises: scanning said n-bit positional signal with a latch circuit using changing points of said incremental signal, and loading the n-bit positional signal into said counting circuit through a parallel signal converter.

3. An absolute signal detedting method recited in claim 2, whereby, when the load of the said n-bit positional signal into said counting circuit is completed, a load completion signal is outputted.

4. An absolute signal detecting method recited in claim 1, whereby, when the load of said-n-bit positional signal into said counting circuit is completed, a load completion signal is outputted.

* * * * *

UNITED STATES PATENT AND TRADEMARK OFFICE
CERTIFICATE OF CORRECTION

PATENT NO. : 5,572,199
DATED : November 5, 1996
INVENTOR(S) : S. Seki

It is certified that error appears in the above-indentified patent and that said Letters Patent is hereby corrected as shown below:

```
Column 2, line 10, "n-bit" second occur. should read --n̄-bit--.
line 24, "n-bit" should read --n̄-bit--;
line 55, "n-bit" should read --n̄-bit--;
line 65, "converter 13" should read --converter 100--.
```

Signed and Sealed this

Eighteenth Day of March, 1997

Attest:

BRUCE LEHMAN

Attesting Officer     Commissioner of Patents and Trademarks